United States Patent [19]

Okumura

[11] Patent Number: 4,587,446
[45] Date of Patent: May 6, 1986

[54] FIELD EFFECT TRANSISTOR OUTPUT CIRCUIT OPERABLE BY A REDUCED AMOUNT OF CURRENT

[75] Inventor: Koichiro Okumura, Tokyo, Japan
[73] Assignee: NEC Corporation, Tokyo, Japan
[21] Appl. No.: 499,704
[22] Filed: May 31, 1983
[30] Foreign Application Priority Data
  May 28, 1982 [JP] Japan .................................. 57-90614
[51] Int. Cl.⁴ ........................................ H03K 17/693
[52] U.S. Cl. .................................. 307/473; 307/443;
                                                    307/453; 307/482
[58] Field of Search ............... 307/443, 448, 453, 473,
       307/475, 549, 550, 575, 577, 584, 270, 482, 578

[56] References Cited

U.S. PATENT DOCUMENTS

| | | | |
|---|---|---|---|
| 4,074,237 | 2/1978 | Spampinato | 307/482 X |
| 4,096,398 | 6/1978 | Khaitan | 307/475 |
| 4,284,905 | 8/1981 | Rosenzweig | 307/482 |
| 4,345,172 | 8/1982 | Kobayashi et al. | 307/482 X |
| 4,347,447 | 8/1982 | Proebsting | 307/448 X |
| 4,376,900 | 3/1983 | Metzger | 307/473 |
| 4,443,715 | 4/1984 | Fox | 307/270 |

Primary Examiner—Stanley D. Miller
Assistant Examiner—D. R. Hudspeth
Attorney, Agent, or Firm—Sughrue, Mion, Zinn, Macpeak and Seas

[57] ABSTRACT

An output circuit which can operate at a high-speed and with a small power consumption is disclosed. The output circuit comprises a first series circuit including first and second transistors, an intermediate junction of the first and second transistors being connected to an output terminal, an impedance means, means for connecting one end of the impedance means to a power voltage terminal, and a third transistor connected between the other end of the impedance means to a second voltage terminal, one and the other ends of the impedance means being connected to control electrodes of the second and first transistors, respectively.

13 Claims, 3 Drawing Figures

FIELD EFFECT TRANSISTOR OUTPUT CIRCUIT OPERABLE BY A REDUCED AMOUNT OF CURRENT

The present invention relates to an output circuit, and more particularly to a tri-state output circuit whose output terminal can take a high-impedance state, in addition to binary logic states.

In an information processing integrated circuit such as a microcomputer, signals fed from a ROM, a RAM, an arithmetic unit, a register section and the like are passed through a bus line connected in common to these logic blocks and thereby data transfer is effected between the logic blocks with each other. However, in such data transfer making use of a comon bus line, it is essentially necessary that within a given period regulated by a timing signal only output data of a particular logic block are carried on the bus line. To that end, in order to avoid non-selected logic block from overriding the output data which are output from a selected logic block that is due to output data, at the timing when the selected logic block is outputting data onto the bus line, the output sections of the logic blocks other than the selected logic block that is due to output data are required to take a high-impedance state.

Such a tri-state circuit which can take a high-impedance state is constructed of an output stage having two transistors forming a push-pull structure, an inverter for complementarily controlling the respective transistors in the output stage on the basis of an input signal, and a control circuit which simultaneously makes the two transistors in the output stage non-conducting in response to a control signal thereby to bring the output terminal into a high-impedance state. However, in such an output circuit in the prior art the power supply potential (Vcc) itself cannot be output without level reduction as a high level of an output. More particularly, a high level of the output would take a value of "$V_{cc} - V_{th}$" which is lower than the power supply level $V_{cc}$ by a threshold value $V_{th}$ of the transistor in the output stage. Consequently, the utilization efficiency of the paper supply voltage was poor. Especially, in view of the trend of lowering of the power supply voltage in the recent years, this problem is serious. Furthermore, due to the fact that a high level of the output is lower than the power supply voltage, it was difficult to effectively drive other logic circuits which are to be driven by this output circuit.

Moreover, when the output circuit is held at a high-impedance state by the aforementioned control circuit, there occurs a D.C. current which flows from the output of the inverter controlling the output stage through the aforementioned control circuit to the reference potential such as ground potential. Consequently, excessive power consumption would have been caused.

It is therefore one object of the present invention to provide a tri-state type output circuit having an excellent utilization efficiency of the power supply voltage.

Another object of the present invention is to provide a tri-state type output circuit which can operate at a low power consumption.

Still another object of the present invention is to provide a tri-state circuit which can obtain a high level at an output terminal that is raised up to a power supply potential $V_{cc}$, and in which a switching speed is fast and there is almost no power consumption at a high-impedance state.

According to one aspect of the present invention, there is provided an output circuit comprising a first voltage terminal, a second voltage terminal, an output terminal, a first transistor coupled between the first voltage terminal and the output terminal, a series circuit coupled between the output terminal and the second voltage terminal, the series circuit including second and third transistors connected in series, a data input terminal, a first control terminal, a second control terminal, a fourth transistor coupled between the first voltage terminal and a gate of the second transistor, a fifth transistor coupled between a gate of the first transistor and the second voltage terminal, an impedance coupled between the gate of the second transistor and the gate of the first transistor, a sixth transistor connected in parallel with the fifth transistor, means for supplying gate electrodes of the third and fifth transistors with a signal of the same phase as a signal at said data input terminal, means for connecting a gate of the sixth transistor to said first control terminal, and means for connecting a gate of the fourth transistor to the second control terminal. In the above output circuit, a voltage drop across the impedance is effectively used to control the first and second transistors and hence a simple circuit for controlling the output stage including first to third transistors can be obtained.

According to another aspect of the present invention, there is obtained a tri-state circuit comprising a first insulated gate field effect transistor of the enhancement type having its drain connected to a constant voltage source and its gate applied with a first input signal, a second insulated gate field effect transistor of the depletion type having its drain connected to the source of said first insulated gate field effect transistor and its gate and source connected with each other, a third insulated gate field effect transistor of the enhancement type having its drain connected to the souce of said second insulated gate field effect transistor, its gate applied with a second input signal that has an opposite-phase relation to said first input signal and its source grounded, a fourth insulated gate field effect transistor of enhancement type having its drain connected to the source of said second insulated gate field effect transistor, its gate applied with a third input signal and its source grounded, a fifth insulated gate field effect transistor of the enhancement type having its drain connected to said constant voltage source and its gate connected to the source of said second insulated gate field effect transistor, a sixth insulated gate field effect transistor of the enhancement type having its drain connected to the source of said fifth insulated gate field effect transistor to serve as an output terminal and its gate connected to the source of said first insulated gate field effect transistor, and a seventh insulated gate field effect transistor of the enhancement type having its drain connected to the source of said sixth insulated gate field effect transistor, its gate applied with said third input signal and its source grounded.

The above-mentioned and other features and objects of the present invention will become apparent by reference to the following description of a preferred embodiment of the present invention taken in conjunction with the accompanying drawings, wherein.

While the following description will be made on the assumption that N-channel MOS transistors are used and positive logic system in which a high level represents logic "1" and a low level represents logic "0" is employed. As a matter of course, the present invention can be practiced even by employing other types of transistors and/or negative logic.

Figure 1:
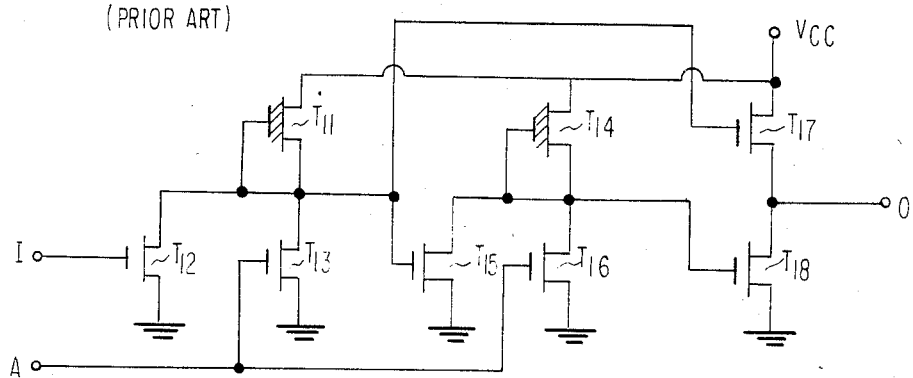
FIG. 1 is a circuit diagram showing a tri-state output circuit in the prior art.

First, the construction and operation of the circuit in the prior art will be explained with reference to FIG. 1.

In the circuit in the prior art shown in FIG. 1, a drain of an insulated gate field effect transistor of the depletion type (hereinafter abbreviated as D-IGFET) $T_{11}$ is connected to a constant voltage source $V_{cc}$. A drain of an insulated gate field effect transistor of the enhancement type (hereinafter abbreviated as E-IGFET) $T_{12}$ is connected to the gate and source of the D-IGFET $T_{11}$, its gate and source are connected to a data input terminal I and the ground potential, respectively. An E-IGFET $T_{13}$ has a drain connected to the gate and source of the D-IGFET $T_{11}$, a gate connected to a control input terminal A and a source grounded. A D-IGFET $T_{14}$ has a drain connected to the constant voltage source $V_{cc}$. An E-IGFET $T_{15}$ has a drain connected to the gate and source of D-IGFET $T_{14}$, a gate connected to D-IGFET $T_{11}$ and a source grounded. An E-IGFET $T_{16}$ has a drain connected to the gate and source of the D-IGFET $T_{14}$, a gate connected to the control input terminal A and a source grounded. AN E-IGFET $T_{17}$ has a drain connected to the constant voltage source $V_{cc}$ and a gate connected to the source of D-IGFET $T_{11}$. An E-IGFET $T_{18}$ has a drain connected to the source of the E-IGFET $T_{17}$ and an output terminal O, a gate connected to the source of D-IGFET $T_{14}$ and a source grounded.

Now the operation of the circuit in the prior art illustrated in FIG. 1 will be explained.

First, when the signal applied to the control input terminal A is at a low level and the signal applied to the data input terminal I is at a low level, since E-IGFETs $T_{12}$ and $T_{13}$ are both non-conducting, the gate of E-IGFET $T_{17}$ is applied with the potential $V_{cc}$, and also since E-IGFET $T_{15}$ becomes conducting, the gate of E-IGFET $T_{18}$ is brought to the ground potential, so that E-IGFET $T_{17}$ becomes conducting while the E-IGFET $T_{18}$ becomes non-conducting. Consequently the output terminal O takes a high level, that is, a potential lower than the potential $V_{cc}$ by the threshold voltage of E-IGFET $T_{17}$.

Next, when the signal applied to the control input terminal A is at a low level and the signal applied to to the data input terminal I is at a high level, since E-IGFET $T_{12}$ is conducting, the gate of E-IGFET $T_{17}$ takes the ground potential, and also since the E-IGFETs $T_{15}$ and $T_{16}$ are both non-conducting and hence the gate of E-IGFET $T_{18}$ takes the potential $V_{cc}$, E-IGFET $T_{17}$ becomes non-conducting while E-IGFET $T_{18}$ becomes conducting, so that the output terminal O is brought to the ground potential. Still further, when the signal applied to the control input terminal A is at a high level, since E-IGFETs $T_{13}$ and $T_{16}$ are both conducting, regardless of the level of the signal applied to the data input terminal I, the potentials at the gates of E-IGFETs $T_{17}$ and $T_{18}$ are both held at the ground potential, so that E-IGFETs $T_{17}$ and $T_{18}$ both become non-conducting and hence the output terminal O takes a high-impedance stage. I this way, by making use of the circuit in the prior art shown in FIG. 1, three states consisting of a high level output stage, a low level output stage and a high-impedance state can be realized.

Figure 3:
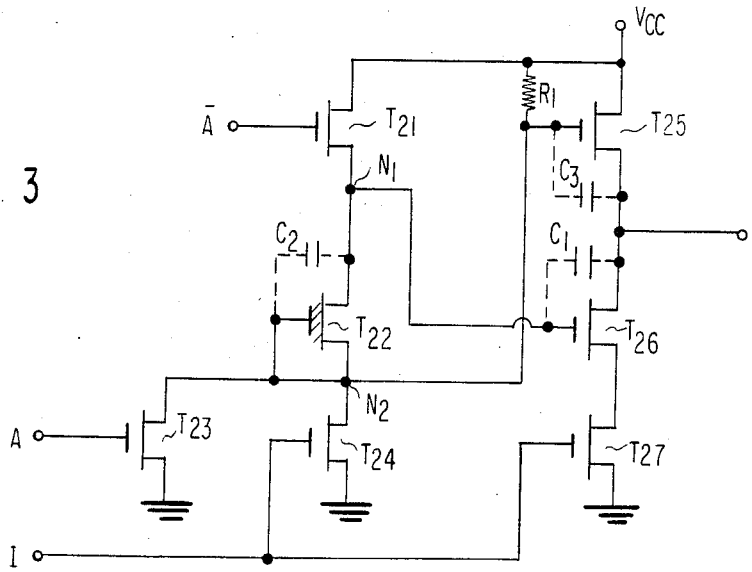
FIG. 3 is a circuit diagram showing a tri-state output circuit according to another preferred embodiment of the present invention.

However, in the prior art circuit shown in FIG. 3, for a high level of output, a voltage $(V_{cc}-V_T)$ is generated ($V_T$ being a threshold voltage of E-IGFET $T_{17}$). Thus, it is impossible to output the full value of $V_{cc}$. Accordingly, the prior art circuit suffers from slow switching speed. Moreover, since E-IGFETs $T_{13}$ and $T_{16}$ were conducting in the high impedance state, the circuit still consumes considerable power in its inactive output state.

Now the construction and operation of the output circuit according to the present invention will be explained in detail with reference to FIG. 2 which shows one preferred embodiment of the present invention.

Figure 2:
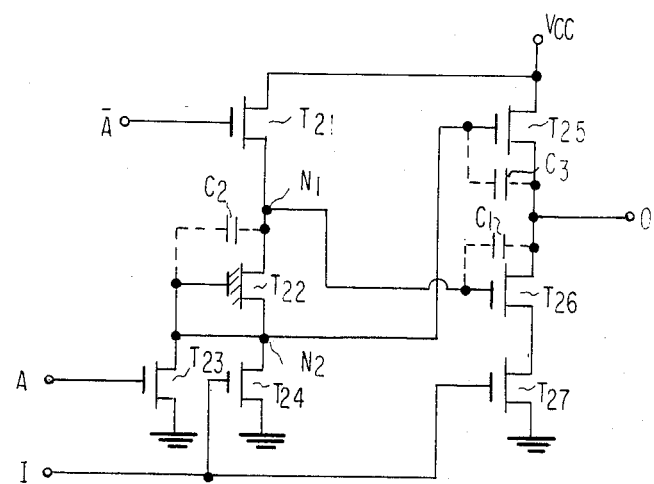
FIG. 2 is a circuit diagram showing a tri-state output circuit according to one preferred embodiment of the present invention.

In the circuit illustrated in FIG. 2, an E-IGFET $T_{21}$ has a drain connected to a constant voltage source $V_{cc}$ and a gate connected to an inverted control signal input terminal $\overline{A}$. A D-IGFET $T_{22}$ has a drain connected to the source of the E-IGFET $T_{21}$ and gate and source connected to each other and operates as an impedance. An E-IGFET $T_{23}$ has a drain connected to the source of the D-IGFET $T_{22}$, a gate connected to a timing signal input terminal A and a source grounded. An E-IGFET $T_{24}$ has a drain connected to the source of the D-IGFET $T_{22}$, a gate connected to a data input terminal I and a source grounded. A drain of an E-IGFET $T_{25}$ is connected to the constant voltage source $V_{cc}$ and its gate is connected to a source of the D-IGFET $T_{22}$. A drain of an E-IGFET $T_{26}$ is connected to the source of the E-IGFET $T_{25}$ and drawn out as an output terminal O and its gate is connected to the source of the E-IGFET $T_{21}$. An E-IGFET $T_{27}$ has a drain connected to the source of the E-IGFET $T_{26}$, a gate connected to the data input terminal I and a source grounded. The one-resistance of D-IGFET $T_{22}$ is selected to a value for causing a sufficient voltage drop there-across when IGFETs $T_{21}$, $T_{22}$ and $T_{24}$ are conducting, which voltage drop is larger than a threshold voltage of E-IGFET $T_{26}$ in absolute value. Namely, the on-resistance of D-IGFET $T_{22}$ is selected in such a manner that a drain potential at a node $N_1$ may make E-IGFET $T_{26}$ conducting while a source potential at a node $N_2$ may make E-IGFET $T_{25}$ non-conducting when $T_{21}$, $T_{22}$ and $T_{24}$ are conducting.

Next, the operation of the tri-state circuit of FIG. 2. will be explained in detail.

When a control signal A is at a low level, its inverted control signal $\overline{A}$ is at a high level and a data signal I is at a high level, E-IGFET $T_{21}$ is conducting and E-IGFET $T_{23}$ is non-conducting. Since E-IGFET $T_{24}$ is conducting, the gate of E-IGFET $T_{25}$ is at a potential corresponding to a low level. Here, since the conductivity of E-IGFET $T_{21}$ is chosen far larger than the conductivity of D-IGFET $T_{22}$, despite of the fact that a current flows through E-IGFET $T_{21}$, D-IGFET $T_{22}$ and E-IGFET $T_{24}$, a voltage corresponding to a high level is applied to the gate of E-IGFET $T_{26}$ from the node $N_1$. Also, since the data input signal I is applied to the gate of E-IGFET $T_{27}$, the gate is held at a high level. Consequently, E-IGFET $T_{25}$ is non-conducting, while E-IGFETS $T_{26}$ and $T_{27}$ are conducting. Therefore, the potential at the output terminal O takes a low level. Subsequently, if the data signal I changes from a high level to a low level, then since E-IGFET $T_{24}$ changes from conducting to non-conducting, E-IGFET $T_{25}$ changes from non-conducting to conducting and also E-IGFET $T_{27}$ changes from conducting to non-conducting, and hence, the potential at the output terminal O would rise. In this instance, since E-IGFET $T_{26}$ is conducting, the channel portion of E-IGFET $T_{26}$ and the gate electrode of E-IGFET $T_{26}$ are capacitively coupled via a gate insulation film of the transistor $T_{26}$. In other words, a capacitance $C_1$ exists between the gate and drain of E-MOST $T_{26}$ and it has been charged with a potential near $V_{cc}$ in previous state. Accordingly, the drain potential of D-IGFET $T_{22}$ rises simultaneously with the potential rise at the output terminal O through a gate-drain capacitance $C_2$ of D-IGFET $T_{22}$ and causes the gate potential of E-IGFET $T_{25}$ to rise through the transistor $T_{22}$ above $V_{cc}$ by a boot-strap effect. Also, a capacitance $C_3$ exists between the gate and source of E-IGFET $C_3$ also contributes to raise the potential at node 2 by the boot-strap effect. Consequently, the conductivity of E-IGFET $T_{25}$ becomes further larger, and hence a high voltage $V_{cc}$ itself would appear at the output terminal O. In this way, as a result of formation of a loop consisting of the coupling capacitances $C_1$ and $C_3$ between the channel sections and gate section of IGFETs $T_{25}$ and $T_{26}$, the capacitance $C_2$, the transistor $T_{22}$ and E-IGFET $T_{25}$, the gate potential of E-IGFET $T_{25}$ becomes higher than the sum of the potential $V_{cc}$ plus the threshold voltage of E-IGFET $T_{25}$. Consequently the output terminal O rises up to the potential $V_{cc}$, and therefore, when the signal applied to the data input terminal I is at a low level, a high level equal to the potential $V_{cc}$ can be obtained at the output terminal O. On the other hand, when the control signal A is at a high level while the inverted control input $\overline{A}$ is at a low level, hence E-IGFET $T_{21}$ is non-conducting and E-IGFET $T_{23}$ is conducting. Hence, since the potential at the gate of E-IGFET $T_{25}$ becomes the ground potential, the transistor $T_{23}$ becomes non-conducting, in addition the gate potential of E-IGFET $T_{26}$ also becomes the ground potential and hence the E-IGFET $T_{26}$ also becomes non-conducting, so that regardless of whether the data input signal I is at a high level or at a low level, the output terminal O would take a high-impedance state, and moreover, under such a state since E-IGFETs $T_{21}$ and $T_{25}$ are non-conducting, there is no current path from the constant voltage source $V_{cc}$ to the ground. Accordingly, power consumption is not present at all.

As described above, in the tri-state circuit according to the present invention, as compared to such type of circuits in the prior art, since a high level of the output voltage can rise up to the potential $V_{cc}$, there is an advantage that a switching speed is fast. Moreover power consumption when the output terminal is in a high-impedance state is not present at all, and also a number of insulated gate field effect transistors forming the circuit is fewer, and therefore it is belivered that the industrial importance of the present invention is very large.

Another embodiment of the present invention will be described with reference to FIG. 3.

In general, while a diffused layer region of one conductivity type formed within a substrate of the opposite conductivity type is generally used as a source or a drain of an insulated gate field effect transistor, normally there exists a leakage current through a P-N junction between the substrate and the diffused layer even in the backward direction although the current is extremely small. Accordingly, in the circuit according to the preferred embodiment of the present invention illustrated in FIG. 2, while the potential $V_{cc}$ appears at the output terminal O when the control signal A is at a low level and the data signal I is at a low level, as time elapses, the potential at the source of E-IGFET $T_{21}$ is lowered due to leakage through the junctions between the substrate and the source of E-IGFET $T_{21}$, the drain and source of E-IGFET $T_{22}$, the drain of E-IGFET $T_{23}$ and the drain of E-IGFET $T_{24}$, and eventually the source potential of E-IGFET $T_{21}$ becomes the value obtained by subtracting the threshold voltage of E-IGFET $T_{21}$ from the potential $V_{cc}$. As a result, the potential at the output terminal O also lowers down to the value obtained by subtracting the threshold voltage of E-IGFET $T_{21}$ and the threshold voltage of the transistor $T_{25}$ from the potential $V_{cc}$.

This embodiment is to improve the above-explained problem. In this embodiment, a resistor $R_1$ having a large resistance is connected between the gate of E-IGFET $T_{25}$ and the power potential $V_{cc}$. Therefore, in the case where the period when the output terminal O is held at a high level is necessitated to be as long as several tens seconds or more, the potential at the output terminal O is clamped at the value obtained by subtracting the threshold voltage of E-IGFET $T_{25}$ from the potential $V_{cc}$ by the resistor $R_1$. However, the case where the period when the output terminal O is held at a high level continues for several tens seconds is extremely rare and could be considered to be not present in practice, and even in the case where the aforementioned clamping resistor is necessitated, by selecting the resistance value of the clamping resistor at a high value of about several hundreds megohms to several gigaohms, the merits possessed by the tri-state circuit according to the present invention, that is, the fast switching characteristic and the low power consumption property when the output terminal O is in a high-impedance state, would not be lost.

While the present invention has been explained above, assuming that N-channel insulated gate field effect transistors are used in the illustrated embodiment for convenience of explanation, even in the case where the tri-state circuit according to the present invention is constructed of P-channel insulated gate field effect transistors, the aforementioned advantages of the present invention would not be lost. In addition, even in the case where an electrostatic capacitance is inserted between the source and gate of the transistor $T_{25}$ and/or between the drain and gate of the transistor $T_{26}$ for the purpose of supplementing the push-up effect for the gate potential of the transistor $T_{26}$, basically the circuit structure does not differ from the inventive concept of the tri-state circuit according to the present invention, and hence such modification is also included in the scope of the present invention, and the effects and advantages of such modified embodiment are identical those of the illustrated embodiment described above.

I claim:
1. An output circuit comprising:
 a first voltage terminal,
 a second voltage terminal,
 an output terminal,
 a first transistor having a drain-source path coupled between said first voltage terminal and said output terminal,
 second and third transistors having drain-source paths coupled in series between said output terminal and said second voltage terminal, a data input terminal, a first control terminal for receiving a first control signal, a second control terminal for receiving a second control signal complementary to said first control signal, a fourth transistor having a drain-source path coupled between said first voltage terminal and a gate of said second transistor, a fifth transistor having a drain-source path coupled between a gate of said first transistor and said second voltage terminal, impedance means coupled between the gate of said second transistor and the gate of said first transistor, a sixth transistor having a drain-source path connected in parallel with the drain-source path of said fifth transistor, means for coupling gates of said third and sixth transistors to said data input terminal, means for coupling a gate of said fifth transistor to said first control terminal, and means for coupling a gate of said fourth transistor with said second control terminal.

2. The circuit according to claim 1, in which said first to sixth transistors are insulated-gate field effect transistors.

3. The circuit according to claim 1, in which said impedance means includes a seventh transistor.

4. The circuit according to claim 3, in which said seventh transistor is of a depletion type.

5. The circuit according to claim 1, further comprising a resistor coupled between the gate of the first transistor and said first voltage terminal.

6. An output circuit comprising:

a first voltage terminal, a second voltage terminal, an output terminal, a first field effect transistor having a drain-source path coupled between said first voltage terminal and said output terminal, second and third field effect transistors having drain-source paths coupled in series between said output terminal and said second voltage terminal, a data input terminal for receiving an input signal, a first circuit node, a second circuit node, a fourth field effect transistor having a drain-source path coupled between said second circuit node and said second voltage terminal, a fifth field effect transistor of a depletion type having a drain-source path coupled between said first circuit node and said second circuit node and having a gate coupled to said second node, first means for connecting said second node to said first voltage terminal, second means for connecting a gate of said first transistor to said second circuit node, third means for coupling gates of said third and fourth transistors to said input signal, and fourth means for connecting said first circuit node to the gate of said second transistor.

7. The circuit according to claim 6, further comprising a sixth field effect transistor connected in parallel with said fourth transistor and means for supplying a gate of said sixth transistor with a first control signal.

8. The circuit according to claim 7, further comprising a seventh field effect transistor controlled by a second control signal having opposite phase to said first control signal, said seventh transistor having a drain-source path connected in parallel with the drain-source path of said fourth transistor.

9. The circuit according to claim 6, further comprising a resistor coupled between said first voltage terminal and the gate of said first transistor.

10. An output circuit comprising:

a first field effect transistor having a drain-source path coupled between a first voltage terminal and an output terminal, second and third field effect transistors having drain-source paths connected in series between said output terminal and a second voltage terminal, means for receiving a first control signal, means for receiving a second control signal complementary to said first control signal, first means for receiving an input signal, means for rendering said second transistor conductive in response to said second control signal, second means for controlling said first and third transistors in complementary manner in response to said input signal when said second control signal is present, and third means for rendering said first and second transistors nonconductive in response to said first control signal irrespective of said input signal.

11. The output circuit according to claim 10, wherein said first means includes a fourth field effect transistor having a drain-source path coupled between said first voltage terminal and the gate of said second transistor and means responsive to said second control signal for rendering said transistor conductive.

12. The output circuit according to claim 11, wherein said second means includes:

a fifth field effect transistor having a drain-source path coupled between the gate of said second transistor and a first node, a sixth field effect transistor having a drain-source path coupled between said first node and said second voltage terminal and having a gate receiving said input signal, and means for connecting said first node to the gate of said first transistor.

13. The output circuit according to claim 12, wherein said third means includes means for operatively short-circuiting between said first node and said second voltage terminal.

* * * * *

UNITED STATES PATENT AND TRADEMARK OFFICE
CERTIFICATE OF CORRECTION

PATENT NO. : 4,587,446
DATED : May 6, 1986
INVENTOR(S) : Koichiro Okumura

It is certified that error appears in the above-identified patent and that said Letters Patent is hereby corrected as shown below:

Column 1, line 43, change "the paper supply" to --the power supply--.

Column 4, line 1, change "stage. I" to --stage. In--;
line 38, change "The one-" to --The on- --.

Column 6, line 41, after "embodiment" insert --,--.

Signed and Sealed this

Twenty-first Day of April, 1987

Attest:

DONALD J. QUIGG

Attesting Officer

Commissioner of Patents and Trademarks